United States Patent
Tu et al.

(10) Patent No.: US 9,780,794 B2
(45) Date of Patent: Oct. 3, 2017

(54) CLOCK AND DATA RECOVERY APPARATUS

(71) Applicant: Novatek Microelectronics Corp., Hsinchu (TW)

(72) Inventors: Chao-Kai Tu, Hsinchu (TW); Rong-Sing Chu, Hsinchu (TW)

(73) Assignee: Novatek Microelectronics Corp., Hsinchu (TW)

( * ) Notice: Subject to any disclaimer, the term of this patent is extended or adjusted under 35 U.S.C. 154(b) by 0 days.

(21) Appl. No.: 14/644,216

(22) Filed: Mar. 11, 2015

(65) Prior Publication Data

US 2016/0043860 A1     Feb. 11, 2016

(30) Foreign Application Priority Data

Aug. 11, 2014    (TW) .............................. 103127481 A

(51) Int. Cl.
| | |
|---|---|
| H03L 7/08 | (2006.01) |
| H03L 7/087 | (2006.01) |
| H03L 7/081 | (2006.01) |
| H04L 7/033 | (2006.01) |
| H04L 7/00 | (2006.01) |

(52) U.S. Cl.
CPC ............ H03L 7/0807 (2013.01); H03L 7/087 (2013.01); H03L 7/0816 (2013.01); H04L 7/0037 (2013.01); H04L 7/0337 (2013.01)

(58) Field of Classification Search
CPC ... H03L 7/0814; H03L 7/091; H04Q 11/0067; H04L 7/0337
USPC ......................................... 375/371, 355, 376
See application file for complete search history.

(56) References Cited

U.S. PATENT DOCUMENTS

| | | | | |
|---|---|---|---|---|
| 4,943,788 A | * | 7/1990 | Laws ...................... | H04L 7/033 331/11 |
| 5,940,609 A | * | 8/1999 | Harrison ................... | G06F 1/06 713/503 |
| 6,867,627 B1 | * | 3/2005 | Murtagh ............... | H03L 7/0812 327/149 |
| 7,212,048 B2 | * | 5/2007 | Metz ........................ | H03L 7/07 327/149 |

(Continued)

FOREIGN PATENT DOCUMENTS

| | | |
|---|---|---|
| TW | 201347495 | 11/2013 |
| TW | 201412031 | 3/2014 |

OTHER PUBLICATIONS

"Office Action of Taiwan Counterpart Application", issued on May 20, 2016, p. 1-p. 8, in which the listed foreign references were cited.

*Primary Examiner* — Helene Tayong
(74) *Attorney, Agent, or Firm* — Jianq Chyun IP Office

(57) ABSTRACT

A clock and data recovery apparatus which includes a voltage controlled delay line (VCDL), a phase detector (PD) and a control voltage generating circuit is provided. The VCDL generates a plurality of clock signals with different phases according to a reference clock signal and a control voltage. The PD detects the phase relationship between a first input signal and a second input signal, and produces a detection result. A data signal or one of the clock signals is used as the first input signal, and one or more of the clock signals is/are used as the second input signal. The control voltage generating circuit generates the control voltage to the VCDL according to the detection result of the PD.

11 Claims, 11 Drawing Sheets

(56) References Cited

U.S. PATENT DOCUMENTS

| | | | |
|---|---|---|---|
| 7,619,456 B2* | 11/2009 | Kim et al. | 327/237 |
| 7,826,583 B2* | 11/2010 | Jeong | H03D 13/004 |
| | | | 375/354 |
| 8,442,178 B2* | 5/2013 | Kim | H03L 7/087 |
| | | | 327/144 |
| 8,811,556 B2 | 8/2014 | Yamaguchi | |
| 8,934,591 B2 | 1/2015 | Tai et al. | |
| 2002/0184577 A1* | 12/2002 | Chow et al. | 714/700 |
| 2003/0058014 A1* | 3/2003 | Krishnamurty | H03L 7/0891 |
| | | | 327/158 |
| 2006/0256909 A1* | 11/2006 | On | H03D 13/004 |
| | | | 375/376 |
| 2007/0001723 A1* | 1/2007 | Lin | H03L 7/0893 |
| | | | 327/156 |
| 2007/0253517 A1* | 11/2007 | Aziz et al. | 375/373 |
| 2008/0080649 A1* | 4/2008 | Gibbons et al. | 375/355 |
| 2008/0101524 A1* | 5/2008 | Jeong et al. | 375/376 |
| 2009/0086872 A1* | 4/2009 | Liu et al. | 375/371 |
| 2010/0013530 A1* | 1/2010 | Kim et al. | 327/149 |
| 2010/0040182 A1* | 2/2010 | Yang et al. | 375/355 |
| 2010/0120389 A1* | 5/2010 | Blum | 455/208 |
| 2010/0302885 A1* | 12/2010 | Rhee et al. | 365/194 |
| 2011/0156779 A1* | 6/2011 | Kim | H03L 7/081 |
| | | | 327/158 |
| 2013/0163706 A1 | 6/2013 | Tai et al. | |
| 2013/0271193 A1* | 10/2013 | Keith | 327/158 |
| 2013/0329776 A1 | 12/2013 | Yamaguchi | |
| 2014/0167820 A1* | 6/2014 | Kashiwakura | H03L 7/089 |
| | | | 327/2 |

\* cited by examiner

CLOCK AND DATA RECOVERY APPARATUS

CROSS-REFERENCE TO RELATED APPLICATION

This application claims the priority benefit of Taiwan application serial no. 103127481, filed on Aug. 11, 2014. The entirety of the above-mentioned patent application is hereby incorporated by reference herein and made a part of this specification.

BACKGROUND

Field of the Invention

The invention is directed to an electronic apparatus and more particularly, to a clock and data recovery (CDR) apparatus.

Description of Related Art

In some channel signal protocols for clock-embedded display interface circuits, a transmitting terminal segments data and forms a packet by adding a plurality of data segments (e.g., N data segments) with a header. The header may contain dummy clock data with a certain transition encoding form, such as "01", "10", "001", "110", "011", "100", "0011" or "1100", such that phase information of clock signals may be embedded into a data signal. A clock and data recovery (CDR) apparatuses at a receiving terminal may extract the clock signals from the data signal according to the dummy clock data contained in the header. CDR apparatuses may generally be categorizes as a delay locked loop (DLL) type and a phase locked loop (PLL) type. In comparison of the two architectures, a conventional DLL type CDR apparatus has better capability for data jitter tolerance, but poor capability for suppressing power noise. The main reason lies on the conventional DLL type CDR apparatus having a recovered clock cycle of N, i.e., the clock signals being corrected per N segments of data. As a result, the conventional DLL type CDR apparatus may not be capable of responding to fast and intense power noise in time.

SUMMARY

The invention provides a clock and data recovery (CDR) apparatus capable of increasing the number of detection/correction times to improve the capability for suppressing noise.

According to an embodiment of the invention, a CDR apparatus including a voltage controlled delay line (VCDL), one or more phase detectors (PDs) and a control voltage generating circuit is provided. The VCDL generates a plurality of clock signals having different phases according to a reference clock signal and a control voltage. Each of the one or more PDs includes a first input terminal and one or more second input terminals. The one or more PDs detect a phase relationship among a first input signal received by the first input terminal and one or more second input signals received by the one or more second input terminals to respectively generate a detection result. A data signal or one of the clock signals is used as the first input signal, and one or more of the clock signals is/are used as the one or more second input signals. The control voltage generating circuit is coupled between the VCDL and an output terminal of the one or more PDs. The control voltage generating circuit correspondingly generates the control voltage at least according to the detection result of the one or more PDs.

In light of the foregoing, the CDR apparatus can contribute to increasing the number of detection/correction times by means of the clock signals with different phases which is output by the VCDL and/or by means of the phase relationship among the high-speed data signal and the clock signals with different phases. Thereby, the capability of the CDR apparatus for suppressing noise can be improved.

In order to make the aforementioned and other features and advantages of the invention more comprehensible, several embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

Figure 1:
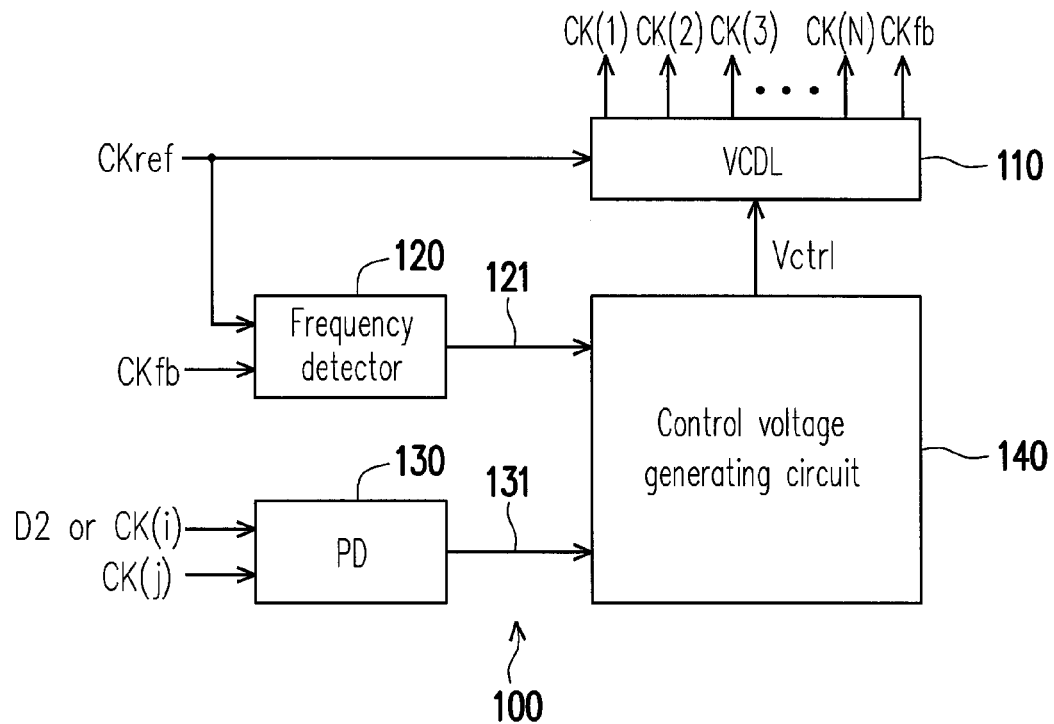
FIG. 1 is a schematic circuit block diagram illustrating a clock and data recovery (CDR) apparatus according to an embodiment of the invention.

A term "couple" used in the full text of the disclosure (including the claims) refers to any direct and indirect connections. For instance, if a first device is described to be coupled to a second device, it is interpreted as that the first device is directly coupled to the second device, or the first device is indirectly coupled to the second device through other devices or connection means. Moreover, wherever possible, components/members/steps using the same referential numbers in the drawings and description refer to the same or like parts. Components/members/steps using the same referential numbers or using the same terms in different embodiments may cross-refer related descriptions.

FIG. 1 is a schematic circuit block diagram illustrating a clock and data recovery (CDR) apparatus 100 according to an embodiment of the invention. Referring to FIG. 1, the CDR apparatus 100 includes a voltage controlled delay line (VCDL) 110, a frequency detector 120, one or more phase detectors (PDs) 130 and a control voltage generating circuit 140. The VCDL 110 may correspondingly generate a plurality of clock signals (e.g., CK(1), CK(2), CK(3), . . . and CK(N) and CKfb illustrated in FIG. 1) with different phases according to a reference clock signal CKref and a control voltage Vctrl generated by the control voltage generating circuit 140. The number (N) of the clock signals may be determined based on actual design requirements. The VCDL 110 of the present embodiment may be implemented in any form. For instance, in some embodiments, the VCDL 110 may be a conventional VCDL circuit including a plurality of delay cells which are connected with each other. The conventional VCDL circuit is a well-known technique and thus, will not be described repeatedly. A delay cell cascade composed of the delay cells may receive the reference clock signal CKref and delay the reference clock signal CKref to obtain the clock signals CK(1) to CK(N) and CKfb. A delay time of each of the delay cells is controlled by the control voltage Vctrl. Thus, the VCDL 110 may adjust a phase relationship among the clock signals CK(1) to CK(N) and the clock signal CKfb according to the control voltage Vctrl.

Figure 2:
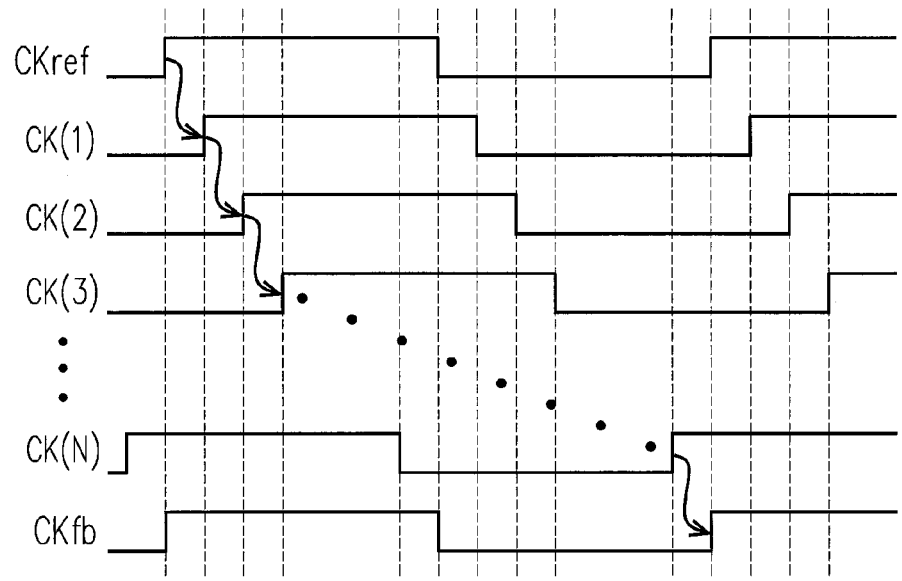
FIG. 2 is a schematic signal timing diagram illustrating the voltage controlled delay line (VCDL) of FIG. 1 according to an embodiment of the invention.

For instance, FIG. 2 is a schematic signal timing diagram illustrating the VCDL 110 of FIG. 1 according to an embodiment of the invention. The delay cell cascade in the VCDL 110 may receive the reference clock signal CKref and obtain the lock signals CK(1) to CK(N) and CKfb by gradually delaying and delivering the reference clock signal CKref, as shown in FIG. 2. A phase difference (delay time) between the clock signals CK(1) to CK(N) and the clock signal CKfb is controlled by the control voltage Vctrl.

With reference to FIG. 1, the frequency detector 120 receives the reference clock signal CKref and a feedback clock signal (i.e., CKfb) among the clock signals generated by the VCDL 110. The frequency detector 120 may detect a frequency relationship (e.g., a frequency deviation) between the reference clock signal CKref and the feedback clock signal CKfb to correspondingly output a detection result 121 to the control voltage generating circuit 140. The frequency detector 120 of the present embodiment may be implemented in any form. For instance, in some embodiments, the frequency detector 120 may be a conventional or any other type of frequency detecting circuit. The conventional is a well-known technique and thus, will not be described repeatedly. The control voltage generating circuit 140 may correspondingly generate/adjust the control voltage Vctrl according to the detection result 121 of the frequency detector 120. Thereby, the control voltage generating circuit 140 may adjust/control frequencies of the clock signals generated by the VCDL 110, such that the frequencies of the clock signals CK(1) to CK(N) and CKfb tends to be in consistence with a frequency of the reference clock signal CKref.

Each of the one or more PDs 130 includes a first input terminal and one or more second input terminals and may detect a phase relationship among a first input signal received by the first input terminal and one or more second input signals received by the one or more second input terminal to respectively generate a detection result 131. In different application examples, the first input signals and the second input signals may be a data signal D2 or the clock signals generated by the VCDL 110. For instance, the data signal D2 or one of the clock signals CK(1) to CK(N) (i.e., a clock signal CK(i)) may be used as the first input signal and transmitted to the first input terminal of each of the one or more PDs 130, and one or more of the clock signals (e.g., a clock signal CK(j)) generated by the VCDL 110 may be used as the one or more second input signals. Various embodiments will be provided below as examples for describing the one or more PDs 130 in detail.

The control voltage generating circuit 140 is coupled with an output terminal of the frequency detector 120, an output terminal of the one or more PDs 130 and a control terminal of the VCDL 110. The control voltage generating circuit 140 may correspondingly generate the control voltage Vctrl according to the detection result 131 output by the one or more PDs 130. The control voltage generating circuit 140 may be implemented in any firm. For instance, details with respect to the implementation of the control voltage generating circuit 140 may refer to descriptions with reference to FIG. 3, FIG. 5, FIG. 9, FIG. 10, FIG. 11, FIG. 12 or FIG. 13 (which will be set forth below).

In light of the foregoing, beside detecting the frequency and/or phase relationship between the reference clock signal CKref and the feedback clock signal CKfb, the control voltage generating circuit 140 of the CDR apparatus 100 may increase the number of detection/correction times by means of the clock signals with different phases which are output by the VCDL 110 and/or by means of the phase relationship among the data signal D and the clock signals with different phases output by the VCDL 110. Thereby, the CDR apparatus 100 can contribute to improving the capability for suppressing noise.

Figure 3:
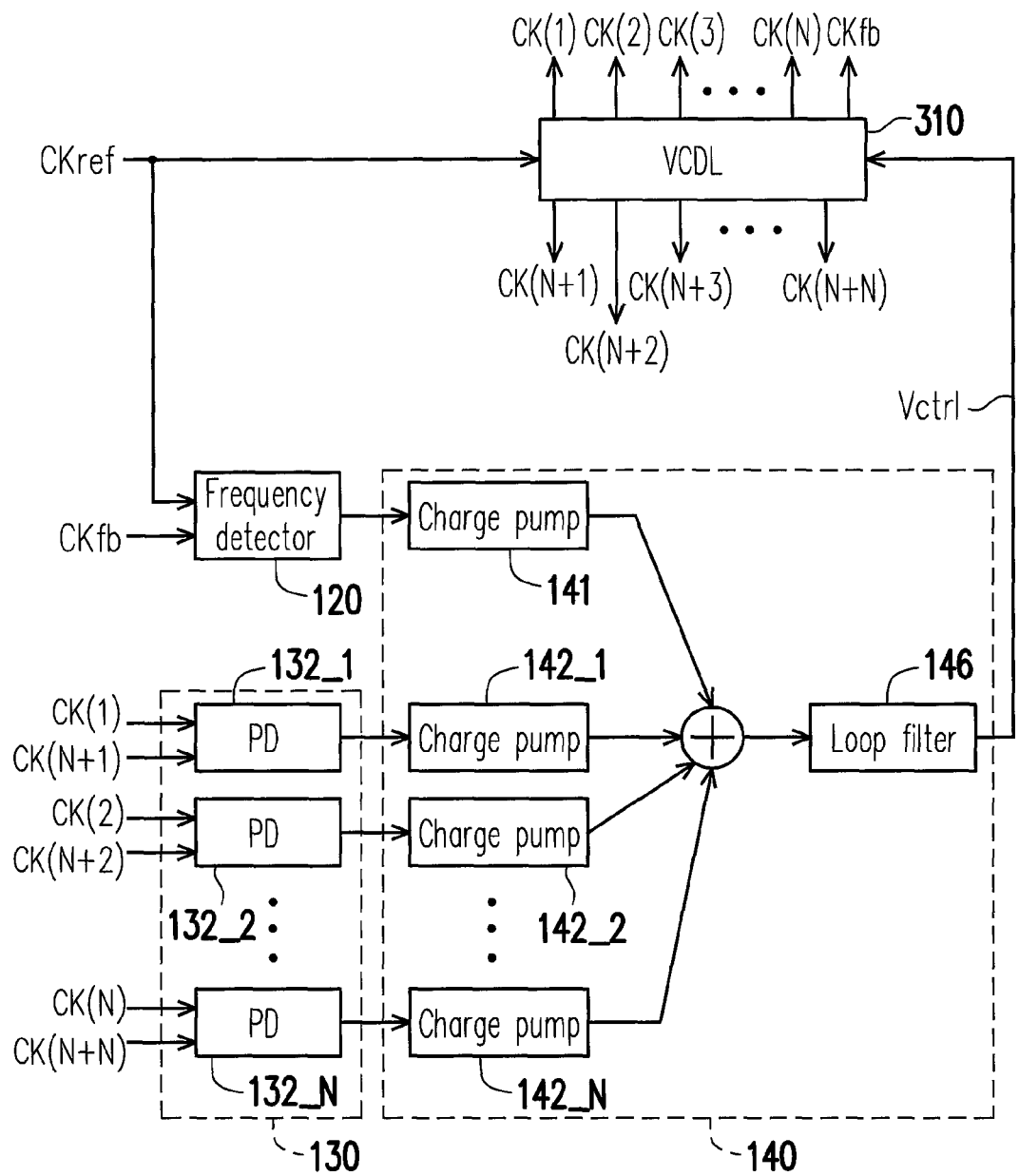
FIG. 3 is a schematic circuit block diagram illustrating a CDR apparatus according to another embodiment of the invention.

FIG. 3 is a schematic circuit block diagram illustrating a CDR apparatus according to another embodiment of the invention. Referring to FIG. 3, the CDR apparatus includes a VCDL 310, a frequency detector 120, one or more PDs 130 and a control voltage generating circuit 140. The CDR apparatus, the VCDL 310, the frequency detector 120, the PDs 130 and the control voltage generating circuit 140 illustrated in FIG. 3 may be deduced with reference to the description related to the CDR apparatus 100, the VCDL 110, the frequency detector 120, the PDs 130 and the control voltage generating circuit 140 illustrated in FIG. 1.

With reference to FIG. 3, the VCDL 310 may correspondingly generate a plurality of clock signals (e.g., CK(1), CK(2), CK(3), . . . and CK(N), CK(N+1), CK(N+2), CK(N+3), . . . and CK(N+N) and CKfb illustrated in FIG. 3) with different phases according to the reference clock signal CKref and the control voltage Vctrl generated by the control voltage generating circuit 140. The VCDL 310 of the present embodiment may be implemented in any form. For instance, in some embodiments, the VCDL 310 may include a delay cell cascade. The delay cell cascade may receive the reference clock signal CKref and delays the reference clock signal CKref to obtain the clock signals CK(1) to CK(N), CKfb and CK(N+1) to CK(N+N). A delay time of each delay cell in the delay cell cascade is controlled by the control voltage Vctrl. Thus, the VCDL 310 may adjust a phase relationship between two of the clock signals CK(1) to CK(N), CKfb and CK(N+1) to CK(N+N) according to the control voltage Vctrl.

Figure 4:
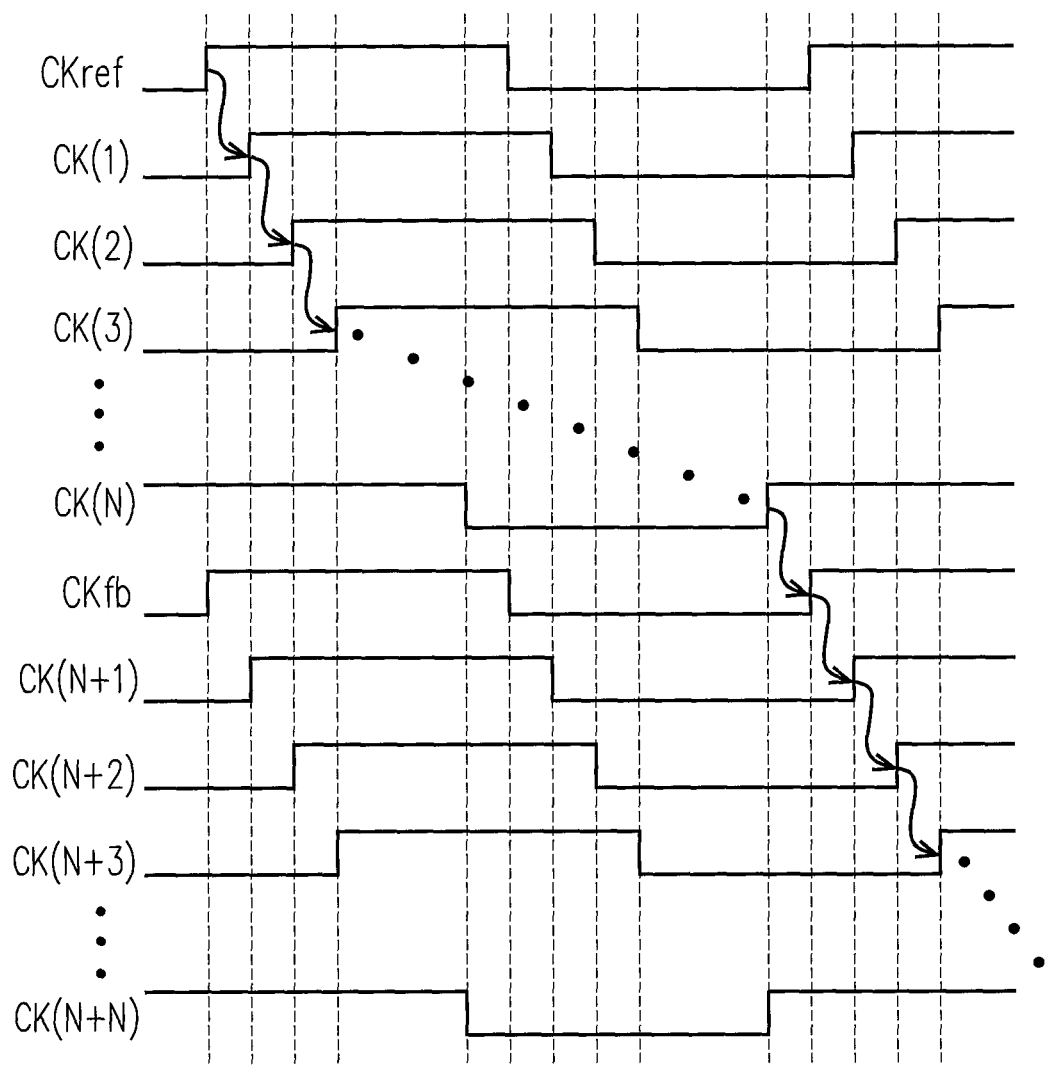
FIG. 4 is a schematic signal timing diagram illustrating the VCDL of FIG. 3 according to another embodiment of the invention.

For instance, FIG. 4 is a schematic signal timing diagram illustrating the VCDL 310 of FIG. 3 according to another embodiment of the invention. The delay cell cascade in the VCDL 310 may receive the reference clock signal CKref and obtain the clock signals CK(1) to CK(N), CKfb and CK(N+1) to CK(N+N) by gradually delivering and delaying the reference clock signal CKref, as shown in FIG. 4. A phase difference (delay time) among the clock signals CK(1) to CK(N), clock signal CKfb and the clock signals CK(N+1) to CK(N+N) is controlled by the control voltage Vctrl.

The PDs 130 illustrated in FIG. 3 include one or more clock-to-clock PDs. For instance, the PDs 130 may include clock-to-clock PDs 132_1, 132_2, . . . and 132_N. Each of the clock-to-clock PDs 132_1 to 132_N may receive and detect the phase relationship between two corresponding clock signals among the clock signals CK(1) to CK(N), CKfb and CK(N+1) to CK(N+N) to correspondingly output the detection result to the control voltage generating circuit 140. The control voltage generating circuit 140 generates the control voltage Vctrl to the VCDL 310 at least according to the detection result output by the clock-to-clock PDs 132_1 to 132_N.

The VCDL 310 may adjust the phase relationship between two of the clock signals CK(1) to CK(N), CKfb and CK(N+1) to CK(N+N) according to the control voltage Vctrl, such that a difference between a phase of a first input signal and a phase of a second input signal in each of the clock-to-clock PDs 132_1 to 132_N is 360 degrees. For instance, the phase difference between the phases of the clock signal CK(1) (i.e., a first input signal) and the clock signal CK(N+1) (i.e., a second input signal) received by the clock-to-clock PD 132_1 may be adjusted to 360 degrees by the VCDL 310. The phase difference between the phases of the clock signal CK(2) (i.e., the first input signal) and the clock signal CK(N+2) (i.e., the second input signal) received by the clock-to-clock PD 132_2 may be adjusted to 360 degrees by the VCDL 310. In the same way, the phase difference between the phases of the clock signal CK(N) (i.e., the first input signal) and the clock signal CK(N+N) (i.e., the second input signal) received by the clock-to-clock PD 132_N may be adjusted to 360 degrees by the VCDL 310.

The control voltage generating circuit 140 illustrated in FIG. 3 includes one or more charge pumps and a loop filter 146. For instance, the control voltage generating circuit 140 may include charge pumps 141, 142_1, 142_2, . . . and 142_N. The charge pumps 141, 142_1 to 142_N may be implemented in any form. For instance, in some embodiments, the charge pumps 141, 142_1 to 142_N may be conventional charge pump circuits or any other type of charge pump circuits. The conventional charge pump circuits are a well-known technique and thus, will not be described repeatedly. An input terminal of the charge pump 141 is coupled to the output terminal of the frequency detector 120 to receive a detection result 121. Each of the charge pumps 142_1 to 142_N has an input terminal coupled to an output terminal of a corresponding PD among the clock-to-clock PDs 132_1 to 132_N. For instance, an input terminal of the charge pumps 142_1 is coupled to an output terminal of the clock-to-clock PD 132_1 to receive a detection result of the clock-to-clock PD 132_1. An input terminal of the charge pump 142_2 is coupled to an output terminal of the clock-to-clock PD 132_2 to receive a detection result of the clock-to-clock PD 132_2. In the same way, the input terminal of the charge pump 142_N is coupled to an output terminal of the clock-to-clock PD 132_N to receive a detection result of the clock-to-clock PD 132_N.

An input terminal of the loop filter 146 is coupled to output terminals of the charge pumps 141, 142_1 to 142_N. An output terminal of the loop filter 146 outputs the control voltage Vctrl. The loop filter 146 of the present embodiment may be implemented in any form. For instance, in some embodiments, the loop filter 146 may be a conventional filter circuit or any other type of filter circuit. The conventional filter circuit is a well-known technique and thus, will not be described repeatedly. The frequency detector 120 outputs a deviation signal (i.e., the detection result 121) according to a frequency deviation between the reference clock signal CKref and the feedback clock signal CKfb. The charge pump 141 charges or discharges the loop filter 146 according to the detection result 121, so as to change the control voltage Vctrl. The clock-to-clock PDs 132_1 to 132_N output a phase deviation signal according to a phase deviation of two input signals of the clock-to-clock PDs 132_1 to 132_N. Each of the charge pumps 142_1 to 142_N charges or discharges the loop filter 146 according to the phase deviation signals, so as to change the control voltage Vctrl.

The control voltage generating circuit 140 may be implemented according to various design requirements, and the implementation should not be limited to the embodiment illustrated in FIG. 3. In other embodiments, the implementation of the control voltage generating circuit 140 of FIG. 3 may be deduced with reference to the description related to the control voltage generating circuit 140 illustrated in FIG. 10 (which will be set forth below).

In light of the foregoing, beside the frequency detector 120 detecting the frequency and/or phase relationship between the reference clock signal CKref and the feedback clock signal CKfb, the clock-to-clock PDs 132_1 to 132_N may further detect the phase error among the clock signals CK(1) to CK(N) and CK(N+1) to CK(N+N) which are output by the VCDL 110. Thereby, the CDR apparatus illustrated in FIG. 3 can contribute to increasing the detection/correction times, so as to improve the capability for suppressing noise.

Figure 5:
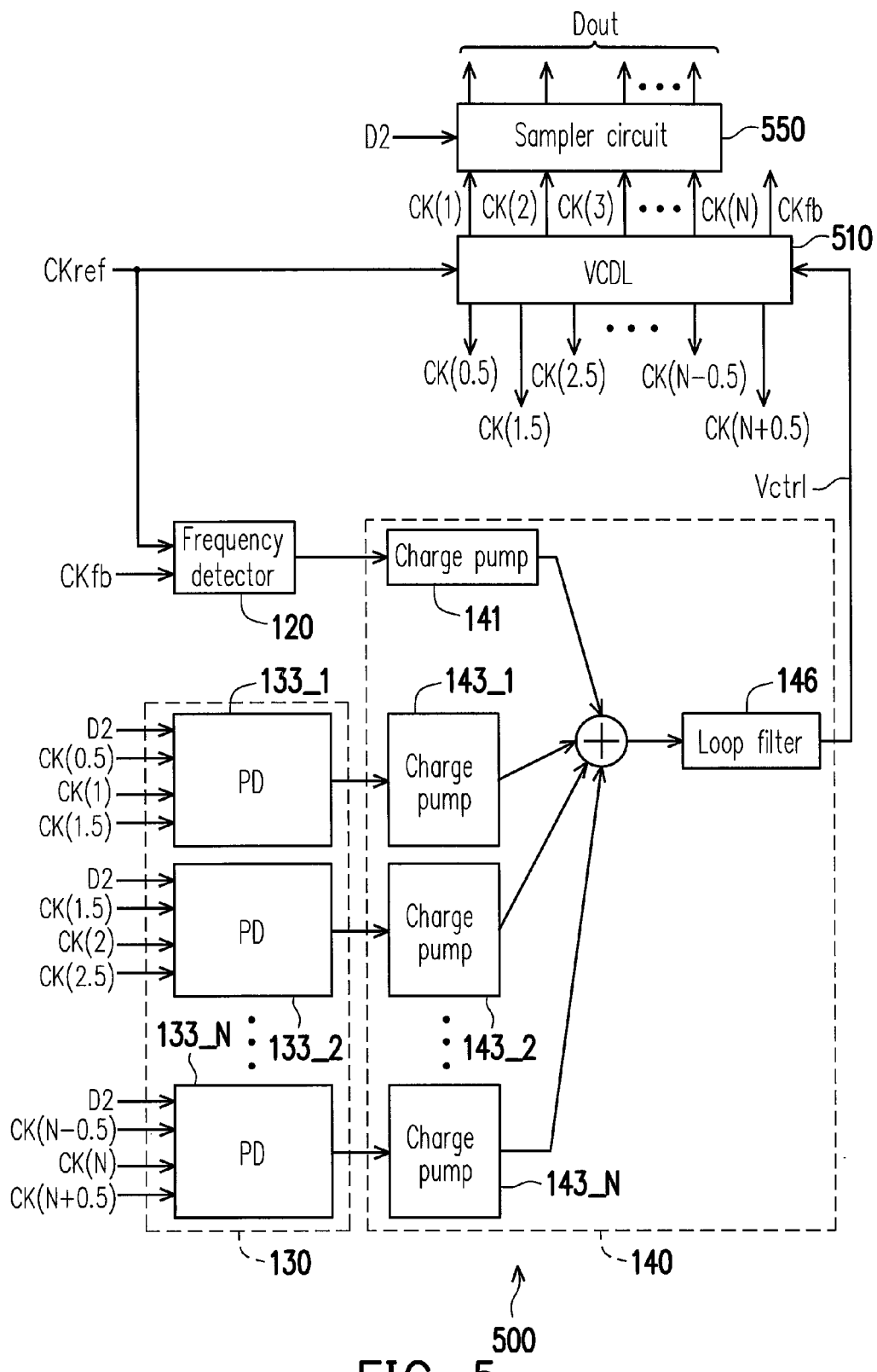
FIG. 5 is a schematic circuit block diagram illustrating a CDR apparatus according to yet another embodiment of the invention.

FIG. 5 is a schematic circuit block diagram illustrating a CDR apparatus 500 according to yet another embodiment of the invention. Referring to FIG. 5, the CDR apparatus 500 includes a VCDL 510, a frequency detector 120, one or more PDs 130, a control voltage generating circuit 140 and a sampler circuit 550. The CDR apparatus 500, the VCDL 510, the frequency detector 120, the PDs 130 and the control voltage generating circuit 140 illustrated in FIG. 5 may be deduced with reference to the description related to the CDR apparatus 100, the VCDL 110, the frequency detector 120, the PDs 130 and the control voltage generating circuit 140 illustrated in FIG. 1.

With reference to FIG. 5, the VCDL 510 may correspondingly generate a plurality of clock signals (e.g., CK(0.5), CK(1), CK(1.5), CK(2), CK(2.5), CK(3), . . . and CK(N−0.5), CK(N), CK(N+0.5) and CKfb illustrated in FIG. 5) with different phases according to the reference clock signal CKref and the control voltage Vctrl generated by the control voltage generating circuit 140. The VCDL 510 of the present embodiment may be implemented in any form. For instance, in some embodiments, VCDL 510 may include a delay cell cascade. The delay cell cascade may receive the reference clock signal CKref and delays the reference clock signal CKref to obtain the clock signals CK(0.5) to CK(N+0.5) and CKfb. A delay time of each delay cell in the delay cell cascade is controlled by the control voltage Vctrl. Thus, the VCDL 510 may adjust a phase relationship among the clock signals CK(0.5) to CK(N+0.5) and CKfb according to the control voltage Vctrl.

A plurality of clock trigger terminals of the sampler circuit 550 are coupled to part of or all of the clock signals (e.g., part of or all of the clock signals CK(1), CK(2), CK(3), . . . and CK(N)) generated by the VCDL 510. A data input terminal of the sampler circuit 550 receives the data signal D2. The sampler circuit 550 samples the data signal D2 according to the clock signals CK(1), CK(2), CK(3), . . . and CK(N) to generate a plurality of output data Dout.

The PDs 130 illustrated in FIG. 5 include one or more clock-to-data PDs. For instance, the PDs 130 may include clock-to-data PDs 133_1, 133_2, . . . and 133_N. Each of the clock-to-data PDs 133_1 to 133_N may receive and detect a phase relationship among the data signal D2 and multiple corresponding clock signals from the clock signals CK(0.5) to CK(N+0.5) to correspondingly output the detection result to the control voltage generating circuit 140. The control voltage generating circuit 140 generates the control voltage Vctrl to the VCDL 510 at least according to a detection result output by one of the clock-to-data PDs 133_1 to 133_N. The VCDL 510 may adjust the phase relationship among the clock signals CK(0.5) to CK(N+0.5) and CKfb according to the control voltage Vctrl, such that phases of the clock signals CK(1), CK(2), CK(3), . . . and CK(N) can match the phase of the data signal D2.

For instance, the clock-to-data PD 133_1 may detect the deviation between the phase of the data signal D2 and phases of the clock signals CK(0.5), CK(1), CK(1.5) and output the phase deviation (i.e., the detection result) to the control voltage generating circuit 140. The clock-to-data PD 133_2 may detect the deviation between the phase of the data signal D2 and phases of the clock signals CK(1.5), CK(2), CK(2.5) and output the phase deviation (i.e., the detection result) to the control voltage generating circuit 140. In the same way, the clock-to-data PD 133_N may detect the deviation between the phase of the data signal D2 and phases of the clock signals CK(N−0.5), CK(N), CK(N+0.5) and output the phase deviation (i.e., the detection result) to the control voltage generating circuit 140. Thereby, the control voltage generating circuit 140 may control the VCDL 510, such that the phases of the clock signals CK(1), CK(2), CK(3), . . . and CK(N) can match the phase of the data signal D2.

Figure 6:
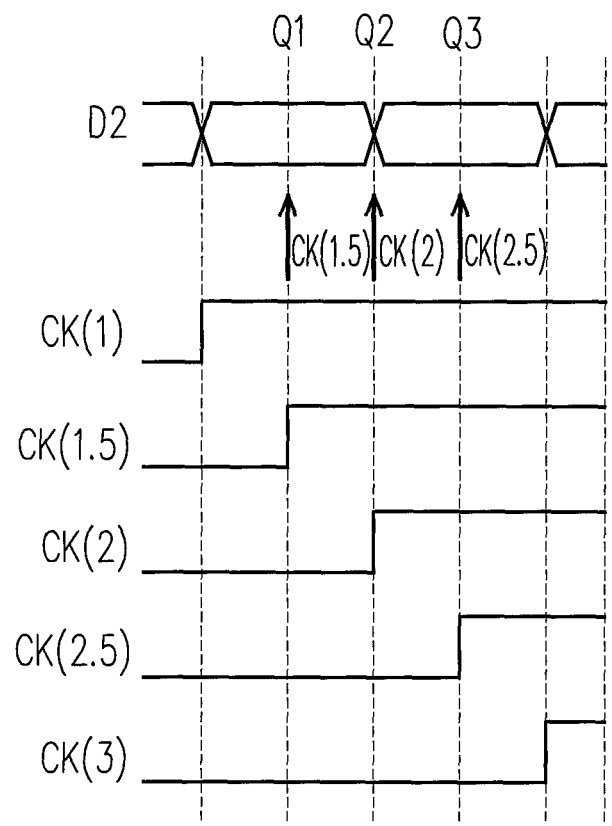
FIG. 6, FIG. 7 and FIG. 8 are signal timing diagrams exemplarily illustrating the clock-to-data PD of FIG. 5 according to different scenarios.
Figure 7:
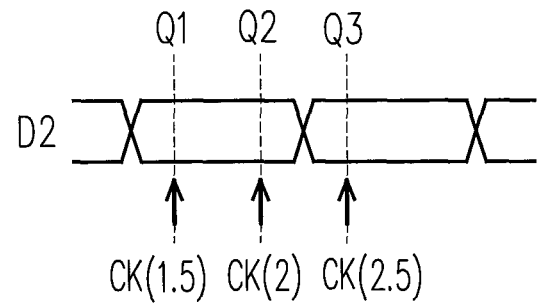
Figure 8:
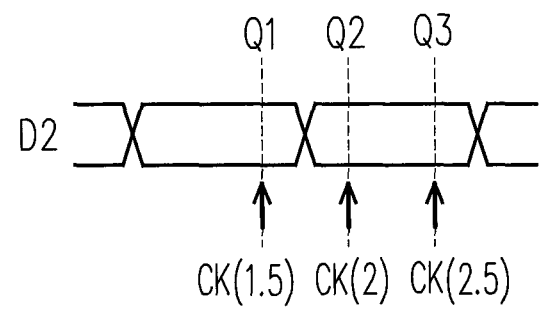

FIG. 6, FIG. 7 and FIG. 8 are signal timing diagrams exemplarily illustrating the clock-to-data PD 133_2 of FIG. 5 according to different scenarios. In FIG. 6, FIG. 7 and FIG. 8, the clock-to-data PD 133_2 is illustrated as an example for description, while the other clock-to-data PDs (e.g., the clock-to-data PDs 133_1 to 133_N) may be deduced with reference to the description related to the clock-to-data PD 133_2. The clock-to-data PD 133_2 may detect the deviation between the data signal D2 and a phase of at least one of the clock signals CK(1.5), CK(2), CK(2.5). The clock-to-data PD 133_2 may sample the data signal D2 according to the time sequence of the clock signals CK(1.5), CK(2), CK(2.5) to obtain sampled data Q1, Q2 and Q3. A truth table of the sampled data Q1, Q2 and Q3 is presented as Table 1.

TABLE 1

Truth table

| State | Q1 | Q2 | Q3 | Meaning |
|---|---|---|---|---|
| 1 | 0 | 0 | 0 | Hold |
| 2 | 0 | 0 | 1 | Early |
| 3 | 0 | 1 | 0 | Hold |
| 4 | 0 | 1 | 1 | Late |
| 5 | 1 | 0 | 0 | Late |
| 6 | 1 | 0 | 1 | Hold |
| 7 | 1 | 1 | 0 | Early |
| 8 | 1 | 1 | 1 | Hold |

FIG. 6 is a schematic diagram illustrating a preferable scenario where the phase of the clock signals CK(2) matches the phase of the data signal D2. In the scenario illustrated in FIG. 6, the clock-to-data PD 133_2 may determine which state in truth table shown in Table 1 each of the sampled data Q1, Q2 and Q3 is in, such that a detection result of "hold" is sent to the control voltage generating circuit 140.

FIG. 7 is a schematic diagram illustrating a scenario where the phase of the clock signals CK(2) is earlier than the phase of the data signal D2. In the scenario shown in FIG. 7, the clock-to-data PD 133_2 may determine which state in the truth table shown in Table 1 each of the sampled data Q1, Q2 and Q3 is in. In case Q1=Q2≠Q3, it represents that an early clock sampling phase occurs, such that the clock-to-data PD 133_2 may send a detection result of "early" to the control voltage generating circuit 140. The control voltage generating circuit 140 is affected by the detection result of the clock-to-data PD 133_2 so as to control the VCDL 510 to delay the phases of the clock signals CK(1.5), CK(2), CK(2.5). Thereby, the VCDL 510 may adjust the phases of the clock signals CK(1.5), CK(2), CK(2.5) to the phases shown in FIG. 6.

FIG. 8 is a schematic diagram illustrating a scenario where the phase of the clock signals CK(2) is later than the phase of the data signal D2. In the scenario shown in FIG. 8, the clock-to-data PD 133_2 may determine which state in the truth table shown in Table 1 each of the sampled data Q1, Q2 and Q3 is in. In case Q1≠Q2=Q3, it represents that a late clock sampling phase occurs, such that the clock-to-data PD 133_2 may send a detection result of "late" to the control voltage generating circuit 140. The control voltage generating circuit 140 is affected by the detection result of the clock-to-data PD 133_2 so as to control the VCDL 510 to advance the phases of the clock signals CK(1.5), CK(2), CK(2.5). Thereby, the VCDL 510 may adjust the phases of the clock signals CK(1.5), CK(2), CK(2.5) to the phases shown in FIG. 6.

The control voltage generating circuit 140 illustrated in FIG. 5 includes one or more charge pumps and a loop filter 146. For instance, the control voltage generating circuit 140 may include charge pumps 141, 143_1, 143_2, . . . and 143_N. The control voltage generating circuit 140, the charge pumps 141, 143_1, 143_2, . . . and 143_N and the loop filter 146 illustrated in FIG. 5 may be deduced with reference to the description related to the control voltage generating circuit 140, the charge pumps 141, 142_1, 142_2, . . . and 142_N and the loop filter 146 illustrated in FIG. 3. An input terminal of the charge pump 141 is coupled to an input terminal of the frequency detector 120 to receive a detection result 121. Each of the charge pumps 143_1 through 143_N has an input terminal coupled to an output terminal of one corresponding PD of the clock-to-data PDs 133_1 to 133_N. For instance, the input terminal of the charge pump 143_1 is coupled to an output terminal of the clock-to-data PD 133_1 to receive a detection result of the clock-to-data PD 133_1. The input terminal of the charge pumps 143_2 is coupled to an output terminal of the clock-to-data PD 133_2 to receive a detection result of the clock-to-data PD 133_2. In the same way, the input terminal of the charge pumps 143_N is coupled to an output terminal of the clock-to-data PD 133_N to receive a detection result of the clock-to-data PD 133_N.

The input terminal of the loop filter 146 is coupled to output terminals of the charge pumps 141, 143_1 to 143_N. The output terminal of the loop filter 146 outputs the control voltage Vctrl. Each of the clock-to-data PDs 133_1 to 133_N outputs a deviation signal according to the phase deviation among the data signal D2 and the clock signals. Each of the charge pumps 143_1 to 143_N charges or discharges the loop filter 146 according to the deviation signal, so as to change the control voltage Vctrl.

The control voltage generating circuit 140 may be implemented according to various design requirements, and the implementation should not be limited to the embodiment illustrated in FIG. 5. In other embodiments, the implementation of the control voltage generating circuit 140 of FIG. 5 may be deduced with reference to the description related to the control voltage generating circuit 140 illustrated in FIG. 10 (which will be set forth below).

In light of the foregoing, beside the frequency detector 120 detecting the frequency and/or phase relationship between the reference clock signal CKref and the feedback clock signal CKfb, the clock-to-data PDs 133_1 to 133_N may further detect the phase deviation among the data signal D2 and the clock signals CK(0.5) to CK(N+0.5) with different phases which are output by the VCDL 110. Thereby, the CDR apparatus 500 can contribute to increasing the detection/correction times, so as to improve the capability for suppressing noise.

Figure 9:
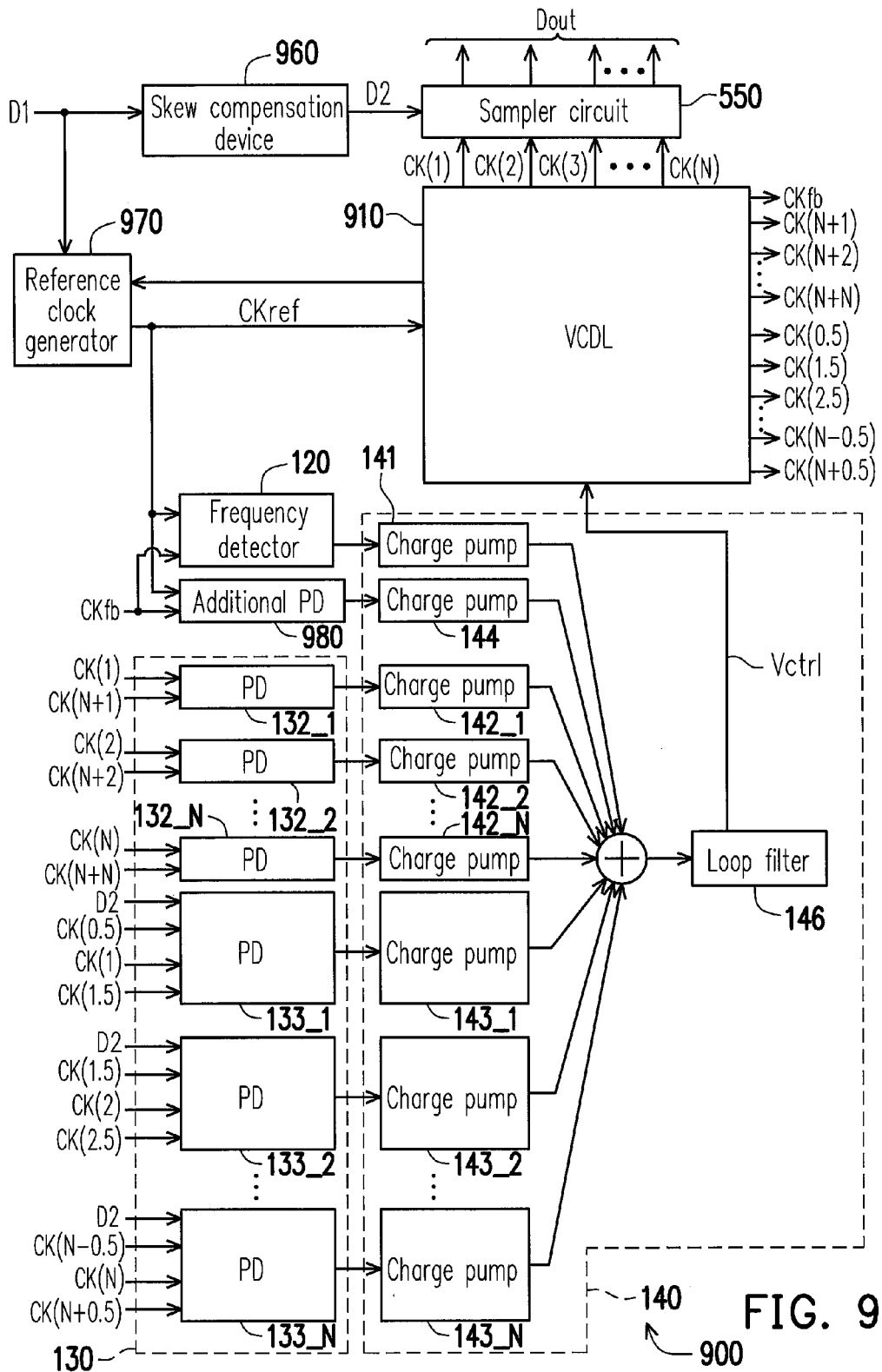
FIG. 9 is a schematic circuit block diagram illustrating a CDR apparatus according to still another embodiment of the invention.

FIG. 9 is a schematic circuit block diagram illustrating a CDR apparatus 900 according to still another embodiment of the invention. Referring to FIG. 9, the CDR apparatus 900 includes a VCDL 910, a frequency detector 120, one or more PDs 130, a control voltage generating circuit 140, a sampler circuit 550, a skew compensation device 960, a reference clock generator 970 and an additional PD 980. The CDR apparatus 900, the VCDL 910, the frequency detector 120, the PDs 130 and the control voltage generating circuit 140 illustrated in FIG. 9 may be reduced with reference to the description related to the CDR apparatus 100, the VCDL 110, the frequency detector 120, PD 130 and the control voltage generating circuit 140 illustrated in FIG. 1. The sampler circuit 550 illustrated in FIG. 9 may be reduced with reference to the description related to the sampler circuit 550 illustrated in FIG. 5.

An input terminal of the reference clock generator 970 receives an original data signal D1, and one or more second input terminals of the reference clock generator 970 receives one or more of the clock signals generated by the VCDL 910. In some clock-embedded interface signal protocols, a header of the original data signal D1 may contain dummy clock data with a certain transition encoding form, such as "01", "10", "001", "110", "011", "100", "0011" or "1100". According to the original data signal D1 and the clock signals generated by the VCDL 910, the reference clock generator 970 may extract/generate the reference clock signal CKref from the header. The reference clock generator 970 of the present embodiment may be implemented in any form. For instance, in some embodiments, the reference clock generator 970 may be a conventional reference clock generator circuit. The conventional reference clock generator circuit is a well-known technique and thus, will not be described repeatedly.

The reference clock generator 970 may extract/generate the reference clock signal CKref from the original data signal D1. Therefore, in comparison with the reference clock signal CKref, the original data signal D1 has a skew amount. An input terminal of the skew compensation device 960 receives the original data signal D1, and an output terminal of the skew compensation device 960 outputs the data signal D2 to a data input terminal of the sampler circuit 550. The skew compensation device 960 may compensate the skew amount of the original data signal D1 to output the compensated data signal D2. The skew compensation device 960 of the present embodiment may be implemented in any form. For instance, in some embodiments, the skew compensation device 960 may be a conventional skew compensation circuit. The conventional skew compensation circuit is a well-known technique and thus, will not be described repeatedly.

With reference to FIG. 9, the VCDL 910 may correspondingly generate a plurality of clock signals (e.g., CK(0.5), CK(1), CK(1.5), CK(2), CK(2.5), CK(3), . . . and CK(N−0.5), CK(N), CK(N+0.5), CK(N+1), CK(N+2), CK(N+3), . . . and CK(N+N) and CKfb illustrated in FIG. 9) with different phases according to the reference clock signal CKref and the control voltage Vctrl generated by the control voltage generating circuit 140. The VCDL 910 of the present embodiment may be implemented in any form. For instance, in some embodiments, the VCDL 910 may include a delay cell cascade. The delay cell cascade may receive the reference clock signal CKref and delays the reference clock signal CKref to obtain the clock signals CK(0.5) to CK(N+0.5), CK(N+1) to CK(N+N) and CKfb. A delay time of each delay cell in the delay cell cascade is controlled by the control voltage Vctrl. Thus, the VCDL 910 may adjust a phase relationship among the clock signals CK(0.5) to CK(N+0.5), CK(N+1) to CK(N+N) and CKfb according to the control voltage Vctrl. Description with respect to the phase relationship among the clock signals CK(0.5) to CK(N+0.5), CK(N+1) to CK(N+N) and CKfb may refer to the description related to FIG. 4 and FIG. 6.

The PDs 130 illustrated in FIG. 9 include one or more clock-to-clock PDs and one or more clock-to-data PDs. For instance, The PDs 130 may include clock-to-clock PDs 132_1, 132_2, . . . and 132_N and clock-to-data PDs 133_1, 133_2, . . . and 133_N. The clock-to-clock PDs 132_1 to 132_N illustrated in FIG. 9 may be reduced with reference to the description related to the clock-to-clock PDs 132_1 to 132_N illustrated in FIG. 3. Each of the clock-to-clock PDs 132_1 to 132_N may receive and detect a phase relationship between two corresponding clock signals among the clock signals CK(1) to CK(N) and CK(N+1) to CK(N+N) to correspondingly output a first detection result to the control voltage generating circuit 140. The clock-to-data PDs 133_1 to 133_N illustrated in FIG. 9 may be reduced with reference to the description related to the clock-to-data PDs 133_1 to 133_N illustrated in FIG. 5. Each of the clock-to-data PDs 133_1 to 133_N may receive and detect the phase relationship among the data signal D2 and multiple corresponding clock signals among the clock signals CK(0.5) to CK(N+0.5) to correspondingly output a second detection result to the control voltage generating circuit 140. The control voltage generating circuit 140 generates the control voltage Vctrl to the VCDL 910 at least according to the first detection result output by the clock-to-clock PDs 132_1 to 132_N and the second detection result output by the clock-to-data PDs 133_1 to 133_N to generate the control voltage Vctrl to the VCDL 910.

The CDR apparatus 900 of FIG. 9 further includes an additional PD 980. The additional PD 980 may receive the reference clock signal CKref and the feedback clock signal CKfb among the clock signals generated by the VCDL 910. The additional PD 980 may detect the phase relationship between the reference clock signal CKref and the feedback clock signal CKfb to correspondingly output a detection result to the control voltage generating circuit 140. The control voltage generating circuit 140 further generates the control voltage Vctrl to the VCDL 910 according to the detection result output by the additional PD 980.

The control voltage generating circuit 140 illustrated in FIG. 9 includes one or more charge pumps and a loop filter 146. For instance, control voltage generating circuit 140 may include charge pumps 141, 144, 142_1, 142_2, . . . and 142_N, 143_1, 143_2, . . . and 143_N. The charge pumps 141, 142_1 to 142_N and the loop filter 146 illustrated in FIG. 9 may be deduced with reference to the description related to the charge pumps 141, 142_1 to 142_N and the loop filter 146 illustrated in FIG. 3 and thus, will not be described repeatedly. The charge pumps 141, 143_1 through 143_N and the loop filter 146 illustrated in FIG. 9 may be deduced with reference to the description related to the charge pumps 141, 143_1 to 143_N and the loop filter 146 illustrated in FIG. 5 and thus, will not be described repeatedly.

The charge pump 144 of the present embodiment may be implemented in any form. For instance, in some embodiments, the charge pump 144 may be a conventional charge pump circuit or any type of charge pump circuit. The charge pump circuit is a well-known technique and thus, will not be described repeatedly. An input terminal of the charge pump 144 is coupled to an output terminal of the additional PD 980 to receive the detection result thereof. The input terminal of the loop filter 146 is coupled to output terminals of the charge pumps 141, 144, 142_1 to 142_N, 143_1 to 143_N. The output terminal of the loop filter 146 outputs the control voltage Vctrl.

The additional PD 980 outputs a deviation signal according to a phase deviation between the reference clock signal CKref and the feedback clock signal CKfb. The charge pump 144 charges or discharges the loop filter 146 according to the deviation signal output by the additional PD 980, so as to change the control voltage Vctrl. Each of the clock-to-clock PDs 132_1 to 132_N outputs a deviation signal according to a phase deviation between two input signals thereof (which are two corresponding clock signals among the clock signals generated by the VCDL 910. Each of the charge pumps 142_1 to 142_N charges or discharges the loop filter 146 according to the deviation signals output by the clock-to-clock PDs 132_1 to 132_N, so as to change the control voltage Vctrl. Each of the clock-to-data PDs 133_1 to 133_N outputs a deviation signal according to a phase deviation among the data signal D2 and the clock signals (i.e., the clock signals correspondingly output by the VCDL 910). Each of the charge pumps 143_1 to 143_N charges or discharges the loop filter 146 according to the deviation signals output by the clock-to-data PDs 133_1 to 133_N, so as to control voltage Vctrl.

In light of the foregoing, beside the frequency detector 120 detecting the frequency relationship between the reference clock signal CKref and the feedback clock signal CKfb, and the additional PD 980 detecting the phase relationship between the reference clock signal CKref and the feedback clock signal CKfb, the clock-to-clock PDs 132_1 to 132_N may further detect the phase deviation among the clock signals CK(1) to CK(N) and CK(N+1) to CK(N+N) with different phases which are output by the VCDL 910, and the clock-to-data PDs 133_1 to 133_N may further detect the phase deviation among the data signal D2 and the clock signals CK(0.5) to CK(N+0.5) with different phases which are output by the VCDL 910. Thereby, the CDR apparatus 900 can contribute to increasing the detection/correction times, so as to improve the capability for suppressing noise.

Figure 10:
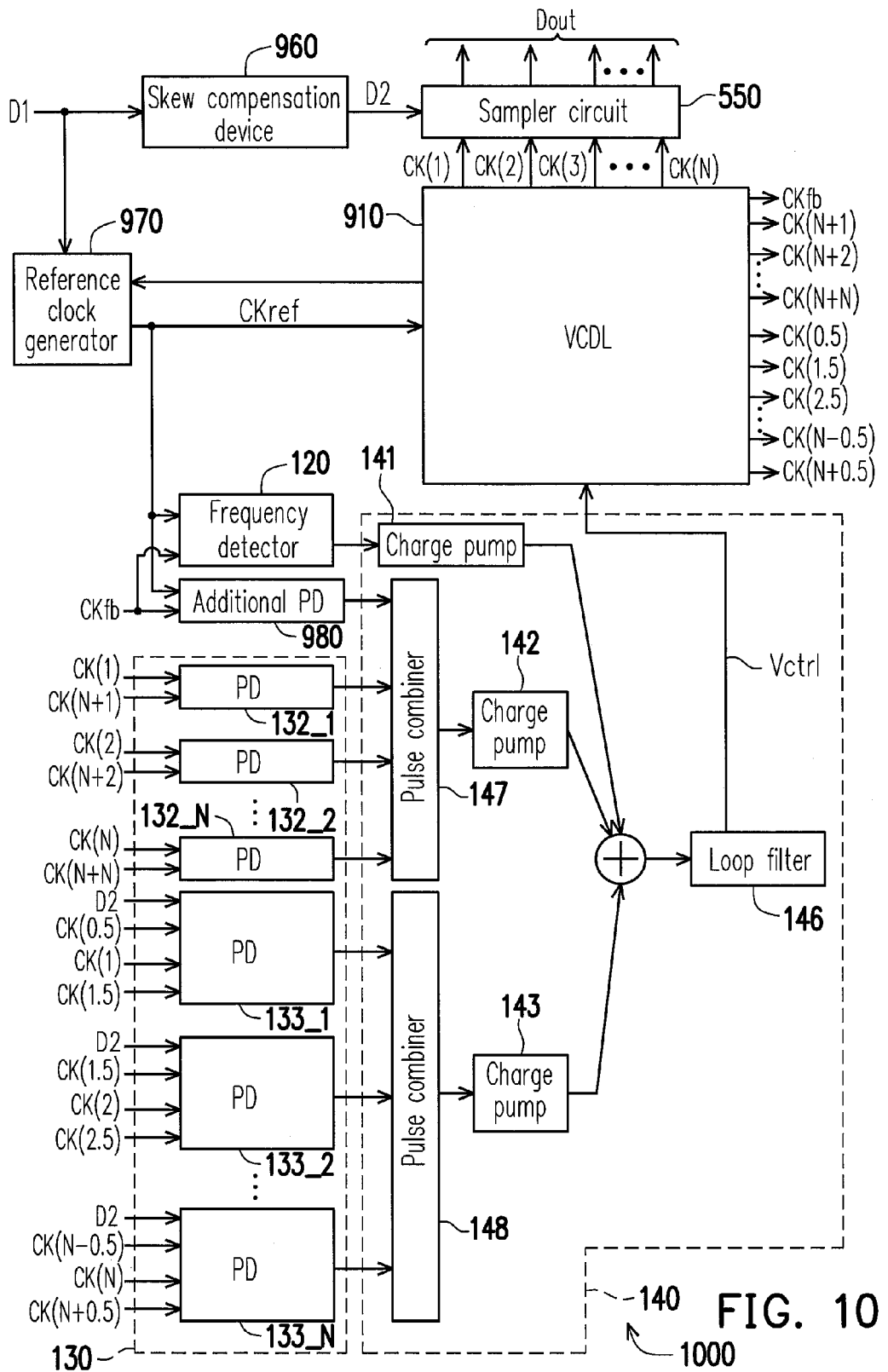
FIG. 10 is a schematic circuit block diagram illustrating a CDR apparatus according to further another embodiment of the invention.

FIG. 10 is a schematic circuit block diagram illustrating a CDR apparatus 1000 according to further another embodiment of the invention. Referring to FIG. 10, the CDR apparatus 1000 includes a VCDL 910, a frequency detector 120, one or more PDs 130, a control voltage generating circuit 140, a sampler circuit 550, a skew compensation device 960, a reference clock generator 970 and an additional PD 980. The CDR apparatus 1000, the VCDL 910, the frequency detector 120, the PD 130 and the control voltage generating circuit 140 may be deduced with reference to the description related to the CDR apparatus 100, the VCDL 110, the frequency detector 120, the PDs 130 and the control voltage generating circuit 140 illustrated in FIG. 1. The CDR apparatus 1000, the VCDL 910, the PDs 130, the sampler circuit 550, the skew compensation device 960, the reference clock generator 970 and the additional PD 980 illustrated in FIG. 10 may be deduced with reference to the description related to the CDR apparatus 900, the VCDL 910, the PDs 130, the sampler circuit 550, the skew compensation device 960, the reference clock generator 970 and the additional PD 980 illustrated in FIG. 9, and thus, will not be described repeatedly.

The control voltage generating circuit 140 of FIG. 10 includes one or more pulse combiners, one or more charge pumps and a loop filter 146. For instance, the control voltage generating circuit 140 may include a pulse combiner 147, a pulse combiner 148, a charge pump 141, a charge pump 142, a charge pump 143 and a loop filter 146. The control voltage generating circuit 140, the charge pumps 141, 142, 143 and the loop filter 146 illustrated in FIG. 10 may be deduced with reference to the description related to the control voltage generating circuit 140, the charge pumps 141, 144, 142_1 to 142_N, 143_1 to 143_N and the loop filter 146 illustrated in FIG. 9.

The pulse combiner 147 has a plurality of input terminals respectively coupled with an output terminal of the additional PD 980 and output terminals of clock-to-clock PDs 132_1 to 132_N. An input terminal of the charge pump 142 is coupled to an output terminal of the pulse combiner 147, and an output terminal of the charge pump 142 is coupled to the input terminal of the loop filter 146. The output terminal of the loop filter 146 outputs the control voltage Vctrl. The pulse combiner 147 may superimpose/combine a pulse output by the additional PD 980 and pulses output by the clock-to-clock PDs 132_1 to 132_N and output a combined pulse signal (i.e., a detection result) to the charge pump 142. The charge pump 142 charges or discharges the loop filter 146 according to a combined pulse signal (i.e., one of the detection results from the additional PD 980 and the clock-to-clock PDs 132_1 to 132_N) output by the pulse combiner 147, so as to change the control voltage Vctrl.

The pulse combiner 148 has a plurality of input terminals respectively coupled to output terminals of the clock-to-data PDs 133_1 to 133_N. An input terminal of the charge pump 143 is coupled to an output terminal of the pulse combiner 148, and an output terminal of the charge pump 143 is coupled to the input terminal of the loop filter 146. The pulse combiner 148 superimpose/combine pulses output by the clock-to-data PDs 133_1 to 133_N and output a combined pulse signal (i.e., a detection result) to the charge pump 143. The charge pump 143 charges or discharges the loop filter 146 according to the combined pulse signal (i.e., one of the detection results from the clock-to-data PDs 133_1 to 133_N) output by the pulse combiner 148, so as to change the control voltage Vctrl.

Figure 11:
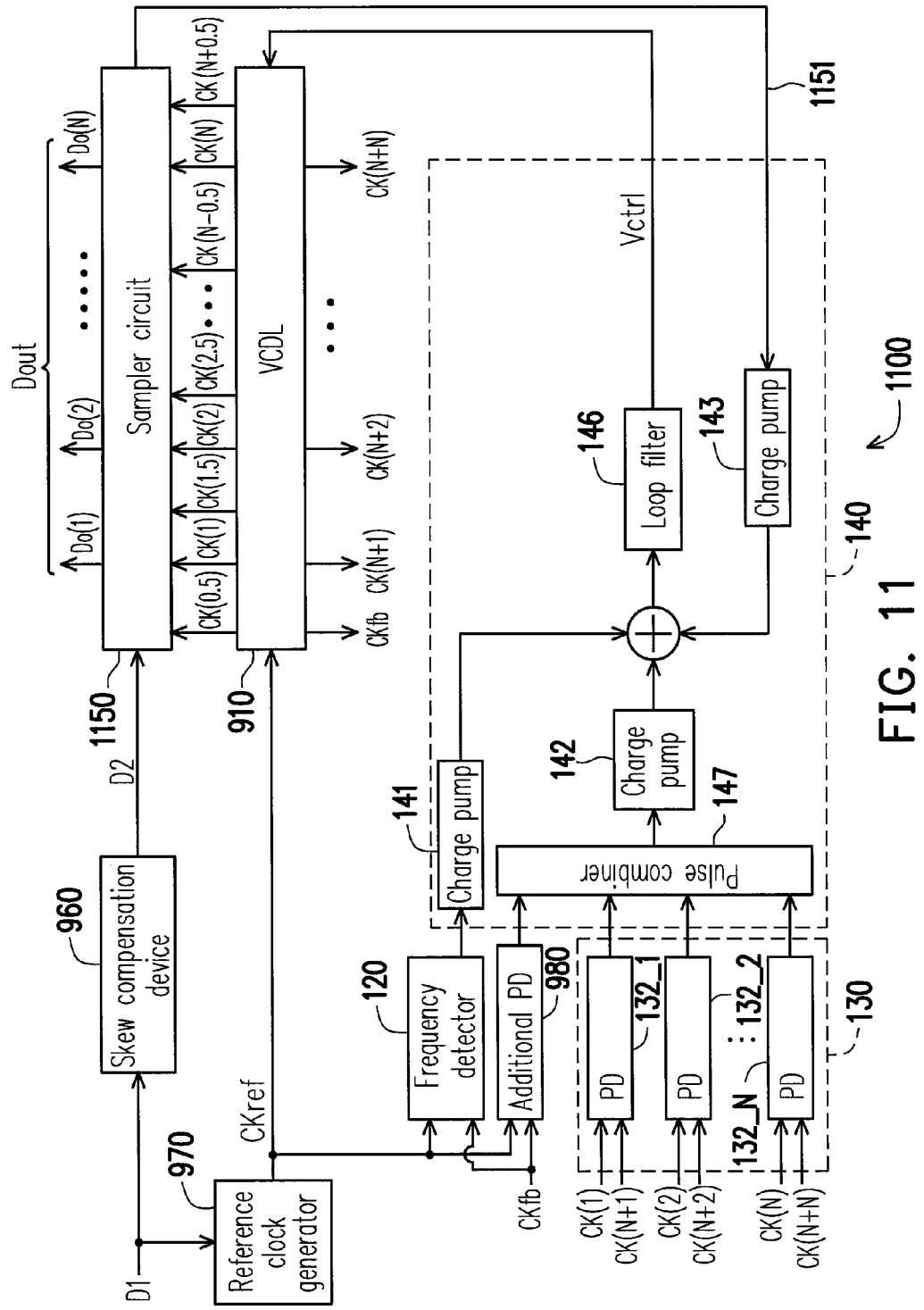
FIG. 11 is a schematic circuit block diagram illustrating a CDR apparatus according to still another embodiment of the invention.

FIG. 11 is a schematic circuit block diagram illustrating a CDR apparatus 1100 according to still another embodiment of the invention. Referring to FIG. 11, the CDR apparatus 1100 includes a VCDL 910, a frequency detector 120, one or more PDs 130, a control voltage generating circuit 140, a sampler circuit 1150, a skew compensation device 960, a reference clock generator 970 and an additional PD 980. The CDR apparatus 1100 and components thereof illustrated in FIG. 11 may be reduced with reference to the description related to the embodiment illustrated in FIG. 10 and thus, will not be described repeatedly.

In the embodiment illustrated in FIG. 11, a plurality of clock trigger terminals of the sampler circuit 1150 is coupled to part of or all of the clock signals output by the VCDL 910 (e.g., clock signals CK(0.5), CK(1), CK(1.5), CK(2), CK(2.5), CK(3), . . . , CK(N−0.5), CK(N) and CK(N+0.5)). A data input terminal of the sampler circuit 1150 receives the data signal D2. The sampler circuit 1150 may sample the data signal D2 according to the clock signals CK(1.5), CK(2.5), . . . , CK(N−0.5) and CK(N+0.5) to generate a plurality of output data Dout. Furthermore, the sampler circuit 1150 may have a clock-to-data PD function. The clock-to-data PD function of the sampler circuit 1150 may be deduced with reference to the description related to the clock-to-data PDs 133_1 to 133_N illustrated in FIG. 5 through FIG. 10. Namely, the sampler circuit 1150 may detect the phase relationship among the data signal D2 and multiple corresponding clock signals among the clock signals CK(0.5) to CK(N+0.5) to correspondingly output a detection result 1151 to the control voltage generating circuit 140.

The control voltage generating circuit 140 of FIG. 11 includes a pulse combiner 147, a charge pump 141, a charge pump 142, a charge pump 143 and a loop filter 146. The control voltage generating circuit 140, the pulse combiner 147, the charge pumps 141, 142, 143 and the loop filter 146 illustrated in FIG. 11 may be deduced with reference to the description related to the control voltage generating circuit 140, the pulse combiner 147, the charge pumps 141, 142, 143 and the loop filter 146 illustrated in FIG. 10. An input terminal of the charge pumps 141 is coupled to the output terminal of the frequency detector 120 to receive the detection result 121. The frequency detector 120 outputs a deviation signal (i.e., the detection result 121) according to the frequency deviation between the reference clock signal CKref and the feedback clock signal CKfb. The charge pump 141 charges or discharges the loop filter 146 according to the detection result 121, so as to change the control voltage Vctrl.

A plurality of input terminals of the pulse combiner 147 are respectively coupled to the output terminal of the coupled to additional PD 980 and output terminals of the clock-to-clock PDs 132_1 to 132_N. The input terminal of the charge pump 142 is coupled to the output terminal of the pulse combiner 147, and the output terminal of the charge pump 142 is coupled to the input terminal of the loop filter 146. The pulse combiner 147 may superimpose/combine the pulse output by the additional PD 980 and the pulses output by the clock-to-clock PDs 132_1 to 132_N and output the combined pulse signal (i.e., the detection result) to the charge pump 142. The charge pump 142 charges or discharges the loop filter 146 according to the combined pulse signal (i.e., one of the detection results from the additional PD 980 and the clock-to-clock PDs 132_1 to 132_N) output by the pulse combiner 147, so as to change the control voltage Vctrl.

The input terminal of the charge pump 143 is coupled to the sampler circuit 1150 to receive the detection result 1151. The output terminal of the charge pump 143 is coupled to the input terminal of the loop filter 146. The sampler circuit 1150 may output the phase deviation (i.e., the detection result 1151) among the data signal D2 and the clock signals to the charge pump 143. The charge pump 143 charges or discharges the loop filter 146 according to the detection result 1151 output by the sampler circuit 1150, so as to change the control voltage Vctrl.

Figure 12:
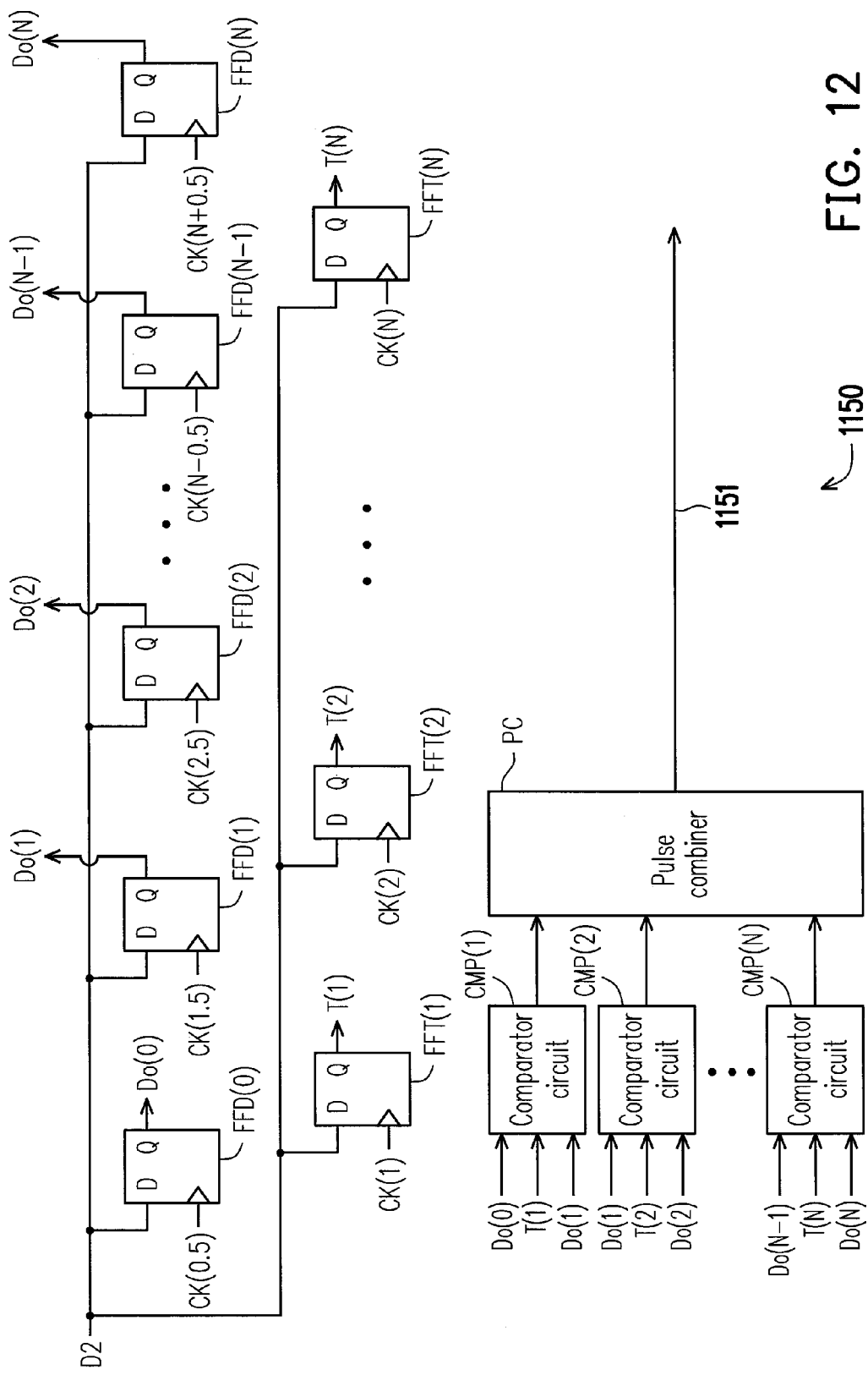
FIG. 12 is a schematic circuit block diagram of the sampler circuit of FIG. 11 according to at least one of the embodiments of the invention.

The implementation is not intent to limit the present embodiment of the sampler circuit 1150. In some embodiments, for instance, the implementation of the sampler circuit 1150 may refer to the description related to FIG. 12. FIG. 12 is a schematic circuit block diagram of the sampler circuit 1150 of FIG. 11 according to at least one of the embodiments of the invention. The sampler circuit 1150 may include flip-flops FFD(0), FFD(1), FFD(2), . . . and FFD (N−1), FFD(N), flip-flops FFT(1), FFT(2), . . . and FFT(N), comparator circuits CMP(1), CMP(2), . . . and CMP(N) and a pulse combiner PC. An input terminal D of each of the flip-flops FFD(0) to FFD(N) and the flip-flops FFT(1) to FFT(N) receives the data signal D2.

A trigger terminal of the flip-flop FFD(0) receives the clock signal CK(0.5). A trigger terminal of the flip-flop FFD(1) receives the clock signal CK(1.5). A trigger terminal of the flip-flop FFD(2) receives the clock signal clock signals CK(2.5). In the same way, a trigger terminal of the flip-flop FFD(N−1) receives the clock signal CK(N−0.5), and a trigger terminal of the flip-flop FFD(N) receives the clock signal CK(N+0.5). According to a time sequence of triggering the clock signals CK(0.5), CK(1.5), CK(2.5), . . . and CK(N−0.5), CK(N+0.5), the flip-flops FFD(0) to FFD (N) may sample the data signal D2 to generate a plurality of output data Do(0), Do(1), Do(2), . . . and Do(N−1), Do(N) from output terminals Q thereof. Therein, the output data Do(1) to Do(N) is used as output data Dout of the CDR apparatus 1100.

A trigger terminal of the flip-flop FFT(1) receives the clock signal CK(1). A trigger terminal of the flip-flop FFT(2) receives the clock signal CK(2). In the same way, a trigger terminal of the flip-flop FFT(N) receives the clock signal clock signals CK(N). According to a time sequence of triggering the clock signals CK(1), CK(2), . . . and CK(N), the flip-flops FFT(0) to FFT(N) may sample the data signal D2 to generate a plurality of transition data T(1), T(2), . . . and T(N) from the output terminals Q thereof.

Three input terminals of the comparator circuit CMP(1) are respectively coupled to the output terminals Q of the flip-flop FFD(0) the flip-flop FFT(1) and flip-flop FFD(1) to respectively receive the output data Do(0), the transition data T(1) and the output data Do(1). If the output data Do(0), the transition data T(1) and the output data Do(1) are respectively considered as the sampled data Q1, Q2 and Q3, the comparator circuit CMP(1) may determine which states in the truth table shown in Table 1 the output data Do(0), the transition data T(1) and the output data Do(1) are respectively in. Thereby, the comparator circuit CMP(1) may correspondingly send detection results respectively representing "Hold", "Early" and "Late" to the pulse combiner PC.

Three input terminals of the comparator circuit CMP(2) are respectively coupled to the output terminals Q of the flip-flop FFD(1), flip-flop FFT(2) and flip-flop FFD(2) to respectively receive the output data Do(1), the transition data T(2) and the output data Do(2). If the output data Do(1), the transition data T(2) and the output data Do(2) are respectively considered as the sampled data Q1, Q2 and Q3, the comparator circuit CMP(2) may determine which states in the truth table shown in Table 1 the output data Do(1), the transition data T(2) and output data Do(2) are respectively in. Thereby, the comparator circuit CMP(2) may correspondingly send detection results respectively representing "Hold", "Early" and "Late" to the pulse combiner PC.

In the same way, three input terminals of the comparator circuit CMP(N) are respectively coupled to the output terminals Q of the flip-flop FFD(N−1), the flip-flop FFT(N)

and the flip-flop FFD(N) to respectively receive the output data Do(N−1), the transition data T(N) and the output data Do(N). If the output data Do(N−1), the transition data T(N) and the output data Do(N) are respectively considered as the sampled data Q1, Q2 and Q3, the comparator circuit CMP (N) may determine which states in the truth table shown in Table 1 the output data Do(N−1), the transition data T(N) and the output data Do(N) are respectively in. Thereby, the comparator circuit CMP(N) may correspondingly send detection results respectively representing "Hold", "Early" and "Late" to the pulse combiner PC.

The pulse combiner PC has a plurality of input terminals respectively coupled to the output terminals of the comparator circuits CMP(1) to CMP(N). The pulse combiner PC may superimpose/combine pulses (i.e., detection results) output by the comparator circuits CMP(1) through CMP(N) and output a combined pulse signal as the detection result 1151. The pulse combiner PC outputs the detection result 1151 to the charge pump 143 of the control voltage generating circuit 140. The charge pump 143 charges or discharges the loop filter 146 according to the combined pulse signal (i.e., one of the detection results from the comparator circuits CMP(1) to CMP(N)) output by the pulse combiner PC, so as to change the control voltage Vctrl.

Figure 13:
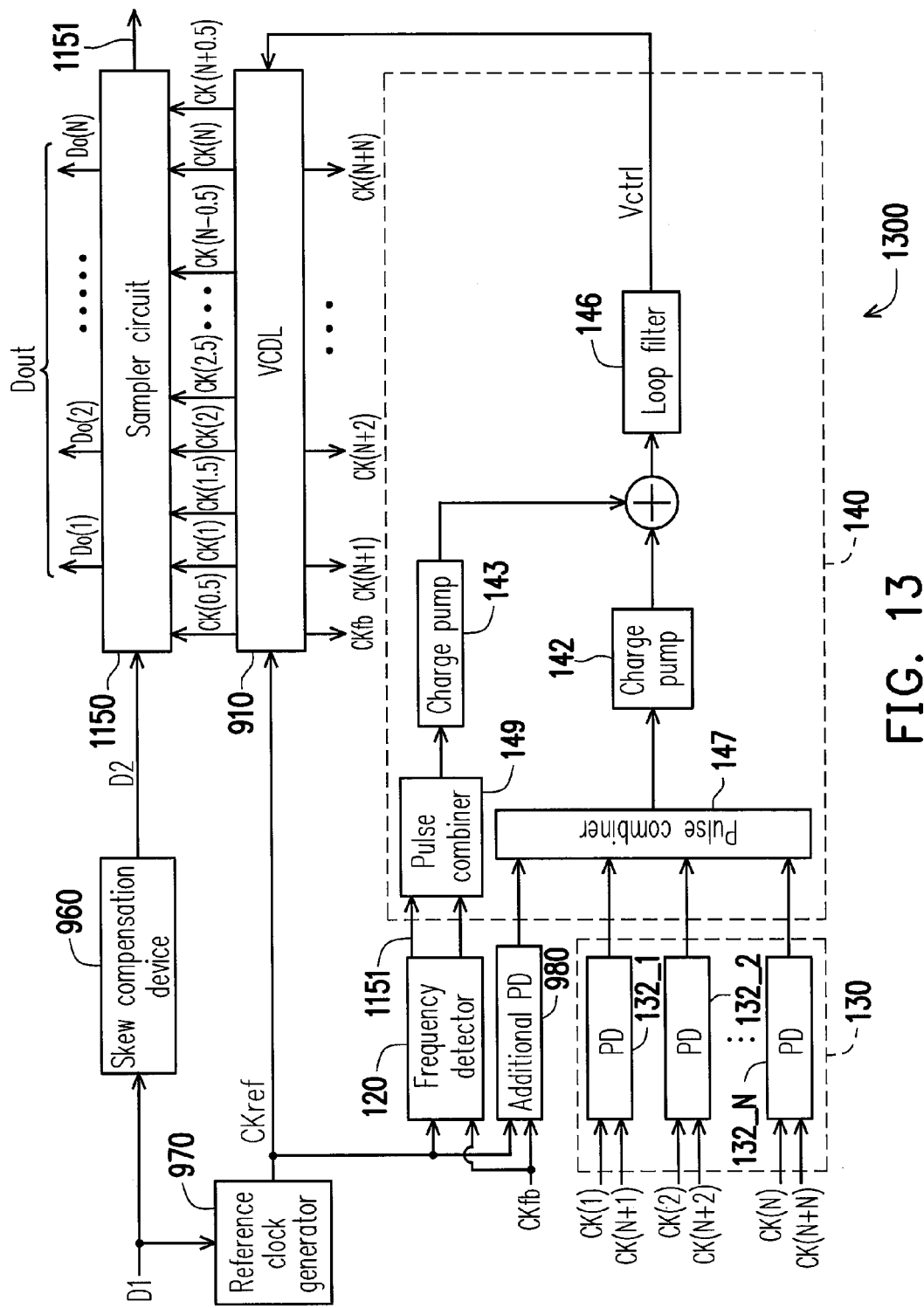
FIG. 13 is a schematic circuit block diagram illustrating a CDR apparatus according to yet another embodiment of the invention.

FIG. 13 is a schematic circuit block diagram illustrating a CDR apparatus 1300 according to yet another embodiment of the invention. Referring to FIG. 13, the CDR apparatus 1300 includes a VCDL 910, a frequency detector 120, one or more PDs 130, a control voltage generating circuit 140, a sampler circuit 1150, a skew compensation device 960, a reference clock generator 970 and an additional PD 980. The CDR apparatus 1300 and components thereof illustrated in FIG. 13 may be reduced with reference to the description related to the embodiment illustrated in FIG. 11 and thus, will not be described repeatedly.

In the embodiment illustrated in FIG. 13, the sampler circuit 1150 may detect the phase relationship among the data signal D2 and multiple corresponding clock signals among the clock signals CK(0.5) to CK(N+0.5) to correspondingly output the detection result 1151 to the control voltage generating circuit 140. The control voltage generating circuit 140 includes a pulse combiner 147, a pulse combiner 149, a charge pump 142, a charge pump 143 and a loop filter 146. The control voltage generating circuit 140, the pulse combiner 147 the pulse combiner 149, the charge pump 142, the charge pump 143 and the loop filter 146 illustrated in FIG. 13 may be deduced with reference to the description related to the control voltage generating circuit 140, the pulse combiner 147, the charge pump 141, the charge pump 142, the charge pump 143 and the loop filter 146 illustrated in FIG. 11.

A plurality of input terminals of the pulse combiners 149 are respectively coupled to the output terminal of the frequency detector 120 and output terminals of the sampler circuit 1150. The input terminal of the charge pump 143 is coupled to an output terminal of the pulse combiner 149, and the output terminal of the charge pump 143 is coupled to the input terminal of the loop filter 146. The pulse combiner 149 may superimpose/combine a pulse output by the frequency detector 120 and the pulse (i.e., the detection result 1151) output by the sampler circuit 1150 to output the combined pulse signal to the charge pump 143. The charge pump 143 charges or discharges the loop filter 146 according to the combined pulse signal (i.e., the detection result of the frequency detector 120 and the detection result of the sampler circuit 1150) output by the pulse combiner 149, so as to change the control voltage Vctrl.

To sum up, the CDR apparatus introduced with reference to the embodiments of the invention can detect a plurality of clock signals with different phases output by the VCDL by means of a plurality of clock phase comparators (i.e., the clock-to-clock PDs) and/or a plurality of clock-to-data PDs. Thereby, the CDR apparatus can contribute to increasing the number of detection/correction times so as to improve the capability for suppressing noise can be improved.

Although the invention has been described with reference to the above embodiments, it will be apparent to one of the ordinary skill in the art that modifications to the described embodiment may be made without departing from the spirit of the invention. Accordingly, the scope of the invention will be defined by the attached claims not by the above detailed descriptions.

What is claimed is:

1. A clock and data recovery apparatus, comprising:
   a voltage controlled delay line (VCDL), generating a plurality of clock signals having different phases according to a reference clock signal and a control voltage;
   one or more phase detectors (PDs), each of the one or more PDs detecting a phase relationship among a data signal and one or more of the clock signals generated by the VCDL to generate a detection result;
   a frequency detector, receiving and detecting a frequency relationship between the reference clock signal and a feedback clock signal among the clock signals to correspondingly output a detection result; and
   a control voltage generating circuit, coupled between the VCDL and an output terminal of the one or more PDs, and coupled between the VCDL and an output terminal of the frequency detector, wherein the control voltage generating circuit generates the control voltage at least according to the detection result of the one or more PDs and the detection result of the frequency detector.

2. The clock and data recovery apparatus according to claim 1, further comprising:
   a clock-to-clock PD, configured to detect a phase relationship between two of the clock signals generated by the VCDL and correspondingly outputting a detection result to the control voltage generating circuit,
   wherein the control voltage generating circuit generates the control voltage at least according to the detection result output by the clock-to-clock PD.

3. The clock and data recovery apparatus according to claim 1, wherein the one or more PDs comprises:
   one or more clock-to-data phase detectors (clock-to-data PDs), each of one or more clock-to-data PDs being configured to detect a phase relationship among the data signal and multiple corresponding clock signals among the clock signals and correspondingly outputting a detection result to the control voltage generating circuit,
   wherein the control voltage generating circuit generates the control voltage at least according to the detection result output by the one or more clock-to-data PDs.

4. The clock and data recovery apparatus according to claim 1, wherein the control voltage generating circuit comprises:
   one or more charge pumps, each of the one or more charge pumps having an input terminal coupled to the output terminal of one corresponding PD of the one or more PDs; and a loop filter, having an input terminal coupled to one or more output terminals of the one or more charge pumps, and an output terminal outputting the control voltage.

5. The clock and data recovery apparatus according to claim 1, wherein the control voltage generating circuit comprises:
one or more pulse combiners, each of the one or more pulse combiners having a plurality of input terminals, and each of the input terminals being coupled to the output terminal of one corresponding PD of the one or more PDs;
one or more charge pumps, each of the one or more charge pumps having an input terminal coupled to an output terminal of one corresponding pulse combiner of the one or more pulse combiners; and
a loop filter, having an input terminal coupled to one or more output terminals of the one or more charge pumps, and an output terminal outputting the control voltage.

6. The clock and data recovery apparatus according to claim 1, further comprising:
an additional phase detector (additional PD), configured to receive and detect a phase relationship between the reference clock signal and a feedback clock signal among the clock signals to correspondingly output a detection result,
wherein the control voltage generating circuit generates the control voltage further according to the detection result of the additional PD.

7. The clock and data recovery apparatus according to claim 1, wherein the clock and data recovery apparatus further comprises:
a reference clock generator, having a first input terminal receiving an original data signal and one or more second input terminals receiving one or more of the clock signals, and generating the reference clock signal according to the original data signal and the one or more clock signals.

8. The clock and data recovery apparatus according to claim 1, further comprising:
a sampler circuit, having a plurality of clock trigger terminals coupled to part of or all of the clock signals and a data input terminal receiving the data signal, and configured to sample the data signal according to the part of or all of the clock signals to generate a plurality of output data.

9. The clock and data recovery apparatus according to claim 8, further comprising:
a skew compensation device, having an input terminal receiving an original data signal and an output terminal outputting the data signal to the data input terminal of the sampler circuit.

10. A clock and data recovery apparatus, comprising:
a voltage controlled delay line (VCDL), generating a plurality of clock signals having different phases according to a reference clock signal and a control voltage;
a phase detector (PD), detecting a phase relationship between a first clock signal of the clock signals generated by the VCDL and a second clock signal of the clock signals generated by the VCDL to generate a detection result;
a frequency detector, receiving and detecting a frequency relationship between the reference clock signal and a feedback clock signal among the clock signals to correspondingly output a detection result; and
a control voltage generating circuit, coupled between the VCDL and an output terminal of the PD, and coupled between the VCDL and an output terminal of the frequency detector, wherein the control voltage generating circuit generates the control voltage at least according to the detection result of the PD and the detection result of the frequency detector.

11. The clock and data recovery apparatus according to claim 10, wherein the VCDL adjusts the phase relationship among the clock signals according to the control voltage, such that difference between a phase of the first input signal and a phase of the second input signal in each of the one or more PDs is 360 degrees.

* * * * *